(12) United States Patent
Armgarth et al.

(10) Patent No.: US 6,642,069 B2
(45) Date of Patent: Nov. 4, 2003

(54) ELECTROCHEMICAL PIXEL DEVICE

(75) Inventors: Mårten Armgarth, Linköping (SE); Karl P. Andersson, Norrköping (SE); David A. Nilsson, Norrköping (SE); Rolf M. Berggren, Vreta Kloster (SE); Thomas Kugler, Linghem (SE); Tommi Remonen, Nyköping (SE)

(73) Assignee: Acreo AB, Kista (SE)

( * ) Notice: Subject to any disclaimer, the term of this patent is extended or adjusted under 35 U.S.C. 154(b) by 0 days.

(21) Appl. No.: 10/091,397

(22) Filed: Mar. 7, 2002

(65) Prior Publication Data

US 2002/0134980 A1 Sep. 26, 2002

Related U.S. Application Data

(60) Provisional application No. 60/276,105, filed on Mar. 16, 2001, and provisional application No. 60/276,218, filed on Mar. 16, 2001.

(30) Foreign Application Priority Data

Mar. 7, 2001 (SE) .............................................. 0100747
Mar. 7, 2001 (SE) .............................................. 0100748

(51) Int. Cl.⁷ .............................................. H01L 21/00
(52) U.S. Cl. ....................................................... 438/22
(58) Field of Search ............................. 438/22, 23, 29, 438/800; 257/80, 88; 359/265, 273, 268; 429/33, 304

(56) References Cited

U.S. PATENT DOCUMENTS

| 4,764,415 A | | 8/1988 | Isoda et al. |
| 4,993,810 A | | 2/1991 | Demiryont |
| 5,049,868 A | * | 9/1991 | Green et al. ................. 359/267 |
| 5,138,481 A | | 8/1992 | Demiryont |

(List continued on next page.)

FOREIGN PATENT DOCUMENTS

| EP | 1 041 653 | 10/2000 |
| WO | WO 94/15246 | 7/1994 |
| WO | 99/10939 | 3/1999 |

OTHER PUBLICATIONS

"Application of Dopant–Induced Structure–Property Changes of Conducting Polymers" by R.H. Baughman and L.W. Shacklette from Science and Applications of Conducting Polymers, Proceedings of the Sixth Europhysics Industrial Workshop held in Lofthus Norway, May 1990, pp. 47 to 61.

J. Solid State Electrochem, vol. 2, No. 2, 1998, V. Rani, K.S.V. Santhanam, "Polycarbazole–Based Electrochemical Transistor", p. 99 to p. 101, Abstract.

Kvarnström et al., In situ spectroelectrochemical characterization of poly(3,4–ethylenedioxythiophene), 1999, Electrochimica Acta 44 (1999) pp. 2739–2750.

*Primary Examiner*—Michael Trinh
(74) *Attorney, Agent, or Firm*—Burns, Doane, Swecker & Mathis, L.L.P.

(57) ABSTRACT

A pixel device comprising an electrochemical transistor device with a source and a drain contact; a gate electrode; an electrochemically active element in direct electrical contact with source and drain contacts, and comprising a transistor channel comprising an organic material; and a solidified electrolyte in direct electrical contact with the active element, and an electrochromic device comprising an electrochromic element comprising a material conducting in at least one oxidation state and an electrochromic material; a solidified electrolyte layer in direct electrical contact with the electrochromic element; and two electrodes for application of a voltage and in direct electrical contact with a component selected from the electrolyte layer(s); in which one of the source and drain contacts of the electrochemical transistor device is in electrical contact with one of the electrodes of the electrochromic device. Also provided are matrices of pixel devices, pixelated displays incorporating the matrices, and process thereof.

55 Claims, 11 Drawing Sheets

U.S. PATENT DOCUMENTS

| | | | |
|---|---|---|---|
| 5,204,937 A | * | 4/1993 | Minnaja ..................... 365/215 |
| 5,300,575 A | | 4/1994 | Jonas et al. |
| 5,347,144 A | | 9/1994 | Garnier et al. |
| 5,444,330 A | | 8/1995 | Leventis et al. |
| 5,446,577 A | | 8/1995 | Bennett et al. |
| 5,742,424 A | | 4/1998 | Coleman |
| 5,754,329 A | | 5/1998 | Coleman |
| 5,812,300 A | | 9/1998 | Coleman |
| 5,877,888 A | | 3/1999 | Coleman |
| 5,912,759 A | * | 6/1999 | Good et al. ................. 359/297 |
| 6,118,572 A | | 9/2000 | Kostecki et al. |
| 6,175,441 B1 | | 1/2001 | Heuer et al. |
| 6,194,072 B1 | | 2/2001 | Hambitzer et al. |
| 6,277,523 B1 | * | 8/2001 | Giron ......................... 429/304 |
| 6,369,934 B1 | * | 4/2002 | Bechinger et al. .......... 359/265 |
| 6,444,400 B1 | | 9/2002 | Cloots et al. |
| 2002/0053320 A1 | | 5/2002 | Duthaler et al. |

\* cited by examiner

ELECTROCHEMICAL PIXEL DEVICE

Priority is claimed under 35 U.S.C. §119(a) for the filing of Swedish Application Nos. 0100747-5 and 0100748-3 on Mar. 7, 2001, and under 35 U.S.C. §119(e) for the filing of U.S. Provisional Application Nos. 60/276,105 and 60/276,218 on Mar. 16, 2001.

FIELD OF THE INVENTION

The present invention is related to electrochemical devices, in particular to printable, electrochemical pixel devices based on conducting organic materials and electrochromic materials. The invention also relates to a process for the production of an electrochemical pixel device, and to matrices of electrochemical pixel devices.

BACKGROUND OF THE INVENTION

Semiconducting and conducting organic materials, both polymers and molecules, have successfully been included in a large range of electronic devices, e g electrochemical devices, for instance as dynamic colorants in smart windows and in polymer batteries. Reversible doping and de-doping involving mobile ions:switches the material between different redox states.

Use has been made of semiconducting polymers for the realisation of field effect transistor (FET) devices. The transistor channel of these devices comprises the semiconducting polymer in question, and their function is based on changes in charge carrier characteristics in the semiconducting polymer, caused by an externally applied electric field. In such transistors, the polymer is used as a traditional semiconductor, in that the electric field merely redistributes charges within the polymer material. One such transistor has been realised, which is adapted for miniaturisation and can be used for the production of integrated circuits consisting entirely of polymer material (PCT publication WO99/10939). A stack of sandwiched layers is described, with either a top-gate or a bottom-gate structure. A transistor device with a similar architecture, also using a polymer as semiconducting material in the channel of the transistor, is described in the European patent application EP1041653.

Another type of transistor device based on organic materials utilises electrochemical redox reactions in the organic material. These devices comprise an electrolyte and a conducting polymer that can be switched between an oxidised and a reduced state. One of these oxidation states then corresponds to low, preferably zero, conductivity in the material, whereas the other oxidation state corresponds to a high conductivity relative to the first state. Electrochemical transistor devices have been used as sensors, e g for detection of oxidant in a solution (see, for review, Baughman and Shacklette, Proceedings of the Sixth Europhysics Industrial Workshop (1990), p 47–61). Furthermore, a transistor of the electrochemical type is reported in Rani et al, J Solid State Electrochem (1998), vol 2, p 99–101. The gate electrode architecture in this prior art transistor is shown in FIG. 1 of this reference.

Electrochromic materials exhibit colour changes or changes in optical density as a result of electrochemical reduction and/or oxidation reaction;. An electrochromic material can either be present as a solid, or exist as molecular, neutral or ionic species in an electrolyte solution. These materials have been used for the creation of electrochromic cells, where the passage of electric charge causes colour changes in the materials. Electrochromic cells are used in electrochromic devices of different kinds, and two principal categories of these devices can be distinguished. The two categories differ from each other mainly in the arrangement of the elements of the electrochromic cell.

The first category of electrochromic devices utilises a sandwich construction, and is used in applications such as automobile windows, building windows, sunglasses, large billboards, mirrors with variable reflectance, sunroofs etc. In this type of electrochromic device, continuous layers of electrochromic material and electrolyte (as well as other layers of e g ion reservoir material) are confined between two electrodes that completely cover the layers of electrochromic material and electrolyte. For the electrochromic device to be of use, at least one of said electrodes has to be transparent to let light through the device. This requirement is met in the prior art through the use of electrode materials such as indium-doped tin oxide (ITO), tin dioxide or fluorine-doped tin dioxide. The electrochromic materials used in these applications vary, but are often based on heavy metal oxides such as $WO_3$ or conducting polymers such as polyaniline or polypyrrole. The conducting, electrochromic polymer poly-(3,4-ethylendioxythiophene) (PEDOT) has attracted much study, and sandwich devices incorporating this polymer have been realised.

The second category of electrochromic devices aim at providing an electrically updateable display for realisation on a flexible support. U.S. Pat. No. 5,754,329 describes such a display, in which the electrodes of the electrochromic device are placed in one and the same plane, contacting a layer of electrochromic material for the generation of local colour effects at the interface between the electrochromic material and the electrodes. U.S. Pat. No. 5,877,888 represents a further development of this device, describing a two-sided display. However, the arrangement of the component layers of the electrochromic device is similar to that of the device of the U.S. Pat No. 5,754,329, considering that the electrodes on either side of the display support contact electrochromic material only, and the generation of electrochromic effects is confined to the area of the electrodes. The electrochromic materials that are used in these devices are described in detail in U.S. Pat. No. 5,812,300.

Active addressing of pixel displays is described e g by Firester A H, in "Active Matrix Technology", chapter 5 of "Flat-Panel Display Technologies", eds Tannas, Glenn, Doane et al, 1995 (ISBN 0-8155-1387-9) The prior art in this field may furthermore be represented by U.S. Pat. Nos. 6,157,356, 6,023,259 and 6,072,517. Active matrix driven OLED-displays (organic light emitting displays) have been realised by e g Philips and Cambridge Display Technology (CDT). In parallel to what was noted in connection with transistors above, the transistors used in all of these applications, when employing a polytler material, utilise the polymer material as a traditional semiconductor.

Problems with the pixel matrices in the displays of the prior art mentioned above include the fact that they are difficult and expensive to manufacture. In particular, no electrochemical pixel devices have been disclosed which are truly capable of being mass produced. Furthermore, the practical use of the pixel elements in the prior art devices has been hampered by their comparatively high power consumption. Also, materials used in prior art devices suffer from a lack of environmental friendliness, processability and economic production possibilities. There is therefore a need for new and improved pixel devices for incorporation in matrices that may be used in displays.

SUMMARY OF THE INVENTION

One of the objects of the present invention is then to meet this demand, by developing the art of electrochemical pixel devices, and by providing a device with handling, production, disposal and other characteristics superior to those of the prior arts.

Another object of the present invention is to provide an electrochemical pixel devict which can be deposited on a large range of different rigid or flexible substrates by conventional printing methods.

Yet another object of the present invention is to provide an environmentally safe electrochemical pixel device, so that the disposal of the device, along with any support onto which it has been deposited, doesn't give rise to handling problems, and so that no safety restrictions have to be imposed on the use of the device.

Another object of the present invention is to provide an actively addressed matrix display, offering versatility and ease of design, and enabling a good picture quality.

Still another object of the present invention is to make possible new applications of conpducting organic materials, using several different properties of such materials in combination.

A further object of the invention is to provide processes for the production of such devices, which processes utilise conventional printing methods or other deposition techniques that are well known, relatively unexpensive and easily scaled up.

The aforementioned objects are met by the invention as defined in the independent claims. Specific embodiments of the invention are defined in the dependent claims. In addition, the present invention has other advantages and features apparent from the detailed description below.

Thus, an electrochemical pixel device is provided, which comprises the following components:

(A) an electrochemical transistor device comprising: a source contact; a drain contact; at least one gate electrode; an electrochemically active element arranged between, and in direct electrical contact with, the source and drain contacts, which electrochemically active element comprises a transistor channel and is of a material comprising an organic material having the ability of electrochemically altering its conductivity through change of redox state thereof; and a solidified electrolyte in direct electrical contact with the electrochemically active element and said at least one gate electrode and interposed between them in such a way that electron flow between the electrochemically active element and said gate electrode(s) is prevented; whereby flow of electrons between source contact and drain contact is controllable by means of a voltage applied to said gate electrodes), and (B) an electrochromic device comprising: at least one electrochromic element comprising (i) at least one material that is electrically conducting in at least one oxidation state and (ii) at least one electrochromic material, wherein said materials (i) and (ii) can be the same or different; at least one layer of a solidified electrolyte which is in direct electrical contact with said electrochromic element; and at least two electrodes adapted for application of a voltage therebetween; each of said electrodes being in direct electrical contact with a component selected from said electrolyte layer(s) and said electrochromic element;
in which pixel device one of said source and drain contacts of the electrochemical transistor device A is in electrical contact with one of the electrodes of the electrochromic device B.

Thus, the invention is based on the finding that a so called "smart pixel", comprising a combination of a transistor and a colour cell, may be assembled by the novel components as described above. Depending on the electrochemical properties of the precise materials used in the electrochemical transistor device A and the electrochromic device B, the electrochromic device P may be connected to either of the source aid drain contacts of the electrochemical transistor device A. The electrochemical pixel device is advantageous in that a voltage applied to the electrochromic display B for colouring or decolouring the electrochromic element may be modulated by controlling the gate voltage of the electrochemical transistor device A. This beneficial property of the electrochemical pixel device of the invention makes it suitable for construction of matrix assemblies of such pixels. The electrochemical pixel devices of the invention may thus be used to form a matrix that may be actively addressed, in a manner known per se in the art.

Electrochemical Transistor Device A

The architecture of the electrochemical transistor device A in the electrochemical pixel device according to the invention is advantageous in that it makes possible the realisation of a layered transistor device with only a few layers, having for example one patterned layer of material comprising a conducting organic material, which layer comprises source and drain contacts and gate electrode(s), as well as the electrochemically active element. The source and drain contacts and the electrochemically active element are then preferably formed by one continuous piece of said material. The source and drain contacts could alternatively be formed from another electrically conducting material in direct electrical contact with the electrochemically active element. The gate electrode(s) may also be of another electrically conducting material. To provide for the necessary electrochemical reactions, whereby the conductivity in the active element is changed, a solidified electrolyte is arranged so that it is in direct electrical contact with both the active element and the gate electrode(s).

In a preferred embodiment, the source and drain contacts and gate electrode(s), as well as the active element, are all arranged to lie in a common plane, further simplifying production of the device by ordinary printing methods. Thus, the electrochemical device according to this embodiment of the invention uses a lateral device architecture. A layer of solidified electrolyte can advantageously be deposited so that it covers, at least partly, the gate electrodes) as well as covering the electrochemically active element. This layer of solidified electrolyte may be continuous or interrupted, depending partly on which of two main types of transistor architectures is to be realised (see below).

The electrochemical transistor device A in the electrochemical pixel device according to the invention allows for control of electron flow between source and drain contacts, and thus for control of the current through the electrochromic element of the electrochromic device B. The conductivity of the transistor channel of the electrochemically active element can be modified, through altering of the redox state of the organic material therein. This is achieved by a application of a voltage to the gate electrode(s), which generates an electric field in the electrolyte. In the contact area between electrolyte and electrochemically active element, electrochemical redox reactions take place, which change the conductivity of the organic material. Either the organic material in the transistor channel is modified from a conducting state to a non-conducting state as a result of said redox reactions, or it is modified from a non-conducting to a conducting state.

As is readily appreciated by the skilled person, and in analogy to conventional field effect transistors, the electrochemical transistor device A in the electrochemical pixel device of the invention may readily be made to function as a diode device through short-circuiting of the gate electrode and source contact, or of the gate electrode and drain contact. Any configuration of the electrochemical transistor device A may be used as a diode in this fashion.

Depending on the precise patterning of the conducting organic material and the electrolyte, the electrochemical transistor device A in the electrochemical pixel device of the invention can either be of a bi-stable or a dynamic type. In the bi-stable transistor embodiment, a voltage applied to the gate electrodes leads to a change in conductivity in the transistor channel that is maintained when the external circuit is broken, i e when the applied voltage is removed. The electrochemical reactions induced by the applied voltage can not be reversed, since the electrochemically active element and the gate electrode(s) are not in direct electrical contact with each other, but separated by electrolyte. In this embodiment, the transistor channel can be switched between non-conducting and conducting states using only small, transient gate voltages. The bi-stable transistor can be kept in an induced redox state for days, and, in the most preferred, ideal case, indefinitely.

Thus, the bi-stable embodiment of the electrochemical transistor device A offers a memory function, in that it is possible to switch the transistor on or off using only a short voltage pulse applied to the gate electrode. The transistor stays in the conducting or non-conducting redox state even after the applied voltage has been removed. A further advantage with such bi-stable transistors is that close to zero-power operation is made possible, since the short voltage pulses applied to the gate need not be larger than a fraction of the gate voltages needed for operation of a corresponding dynamic device.

In the dynamic embodiment of the electrochemical transistor device A, the change in the redox state of the material is reversed spontaneously upon withdrawal of the gate voltage. This reversal is obtained through the provision of a redox sink volume adjacent to the transistor channel in the electrochemically active element. Also, a second gate electrode is provided, and arranged so that the two gate electrodes are positioned on either side of the electrochemically active element, one closer to the transistor channel, and the other closer to the redox sink volume. Both gate electrodes are separated from the electrochemically active element by electrolyte. Application of a voltage between the two gate electrodes results in the electrochemically active element being polarised, whereby redox reactions take place in which the organic material in the transistor channel is reduced while the organic material in the redox sink volume is oxidised, or vice versa. Since the transistor channel and the redox sink volume are in direct electrical contact with each other, withdrawal of gate voltage leads to a spontaneous reversal of the redox reactions, so that the initial conductivity of the transistor channel is re-established. It is to be stressed that in contrast to electrochemical transistors of the prior art, dynamic transistors comprised in this embodiment of the present invention revert spontaneously to the initial conductivity state without the need for a reversing bias.

Electrochromic Device B

The electrochromic device B in the electrochemical pixel device according to the invention comprises an electrochromic element in direct electrical contact with an electrolyte. At least two electrodes of a voltage supply are each in direct electrical contact with either of the electrolyte or electrochromic element, in order to enable supply of charge carriers for colouring, or decolouring, electrochemical reactions. The electrodes may be formed from the same material as the electrochromic element. The contact of electrodes to the electrochromic element, whether directly or via electrolyte, may be made through a lateral or a vertical arrangement, depending on the design of the electrochemical pixel device according to the invention.

In one embodiment, an electrochromic device B of the electrochemical pixel device is provided, in which the electrodes are arranged side by side, in a plane. The electrodes then form an electrode layer, which can be deposited on a support in a conventional manner, and patterned in any desirable fashion. When this arrangement of electrodes is used, the connections formed with the electrolyte or electrochromic element are preferably made with only one layer of said electrolyte or electrochromic element. Alternatively, one of the electrodes is positioned laterally in relation to the electrochromic element, whereas a second electrode is positioned underneath, separated from the electrochromic element by electrolyte. Such a vertical design may be advantageous in the construction of electrochemical pixel devices, since, in this arrangement, several of the components of the electrochromic device, excepting of course the electrochromic element, may be hidden from the viewer. This arrangement of electrochromic element on top of the electrolyte and second electrode is particularly advantageous in the context of a matrix of a plurality of electrochemical pixel devices, which matrix forms a pixelated display. The fact that a maximum portion of the visible face of such a display consists of electrochromic elements gives a maximal picture quality and clarity. Also, the construction of a matrix of electrochemical pixel devices is made simpler with this vertical arrangement of the electrodes of the electrochromic device B, since fewer crossings of conductors with each other need to be designed. This aspect of the design of the electrochromic device B of the electrochemical pixel device of the invention will be discussed in greater detail below.

In some embodiments of the invention, the electrolyte in the electrochromic device B is in the form of a continuous layer, giving rise to a dynamic device in which application of voltage results in a colour change that is reversed upon removing the voltage. In other embodiments of the present invention, an electrochromic device is provided in which the electrolyte is patterned between electrodes. The conduction of ions in this device is then interrupted, so that the application of voltage to the electrochemical cell of the device results in reduction and oxidation reactions that are not reversed upon removing the voltage. Thus, bi-stable switching between states is made possible by these accumulator-like properties of such embodiments of the device.

In embodiments of the invention, an electrochromic device is provided, which comprises at least one further electrochromic material to complement said electrochromic material in the electrochromic element. This makes it possible to realise devices with more than one colour, with for example one colour-generating oxidation reaction and one colour-generating reduction reaction taking place simultaneously at different locations in the device. As a further example, redox reactions giving rise to different colours at the same location, but at different applied voltages, can be designed. This further electrochromic material can be provided within the solidified electrolyte or within the electrochromic element, which then for example comprises an electrochromic redox pair.

Embodiments of the electrochronic device B in the electrochemical pixel device of the invention may also comprise a redox active material which does not in itself give rise to electrochromic effects. Such a material may fulfil any or both of the following two roles: (i) In some arrangements of the electrochrcmic device B, the electrochromic material of the entire volume of the electrochromic element can not be completely oxidised or reduced in the absence of a complementary redox reaction; rather, only part of the material will be oxidised or reduced, respectively. Thus, the addition of a further redox active material makes it possible to fully oxidise or reduce the electrochromic material; (ii) The electrocromic material may be sensitive to over-oxidation, occurring at too high an applied voltage, and destroying the electrochromic material rendering it useless. A further redox active material comprised in the device may serve the function of protecting the electrocromic material from such over-oxidation, through restricting the electric polarisation in the electrochromic element to a value below a threshold value. At this threshold value, the protective, further redox active material will instead be oxidised, protecting the electrochromic material from a polarisation that would otherwise destroy it. As is readily appreciated by the skilled man in the light of what is discussed above, a suitably chosen redox active material, exhibiting electrochromic effects, could serve the function of providing a complementary, colour-generating reaction, at the same time as it provides either or both of the beneficial effects of protection against over-oxidation and enabling of complete reduction/oxidation of the first electrochromic material.

In some embodiments of the electrochromic device B in the electrochemical pixel device of the invention, dynamic or variable colouring effects in the electrochromic device may be generated through use of a combination of different solidified electrolytes, having different ionic conductivities. Parts of an electrochromic element, or some of a plurality of electrochromic elements, may then be in direct electrical contact with such different electrolytes. Electrochromic areas that are in contact with an electrolyte having higher ionic conductivity will colour/decolour faster than electrochromic areas that are in contact with an electrolyte having a lesser ionic conductivity, which makes possible different combinations of image elements with different colouring and decolouring speeds.

As described above, in preferred embodiments of the invention, the source and drain contacts, the electrochemically active element and the gate electrodes of the electrochemical transistor device A are all formed from the same material. Suitably, and provided that the material has electrochromic properties, this material is also used for the formation of the electrochromic element in the electrochromic device B, and, even more preferably, also for the formation of the electrochromic device electrodes. Suitably, in view of the various desirable properties of said material, the common material chosen for the different components is an electrochromic polymer which is conducting in at least one oxidation state. Suitable such polymers are listed in the "Materials" section below.

For the successful operation of the electrochemical pixel device, both the electrochemical transistor device A and the electrochromic device B comprise a solidified electrolyte. In A, the electrolyte makes possible the electrochemical reactions that chance the conductivity in the transistor channel, whereas in B, it enables the electrochemical reactions resulting in a colour change in the electrochromic element. The solidified electrolytes in A and B may be the same or different, and is as defined in the "Materials" section below. For reasons of processability and ease of design, the solidified electrolytes in A and B are preferably the same.

Another aspect of the invention provides a matrix of electrochemical pixel devices as described above. The beneficial process characteristics of the electrochemical pixel device makes it suitable for incorporation in a matrix comprising a plurality of similar or identical pixel devices, in order to form an actively addressed pixel matrix. As is known to the person skilled in the art of displays incorporating actively addressed matrices, such a matrix of pixels exploits the possibility provided by a transistor coupled to a pixel to control the current flows to the colour elements of the pixels. If a matrix according to this aspect of the invention consists of, for example, three rows and three columns of the novel electrochemical pixel devices described herein, there will be nine electrochromic devices b whose colour may be changed individually. There will also be nine electrochemical transistor devices A to control the current. One row or column of the matrix may be updated at a time. In other words, e g all the transistors in the two lowest rows are set to the "off" state, and are thus in a non-conducting state. The transistors in the upper row are set to the conducting or "on" state, so that the colour of all electrochromic devices in this row may be individually changed. After completion of the process for the displays in the first row, the transistors in the first and third row will be set to their "off" states, whereas the transistors in the second row are set to their "on" state in order that the displays in the second row may now be individually updated. By setting the transistors in a row to the "off" state after updating of this row, the charges loaded into the electrochromic elements in question will be trapped there, which in turn means that a certain electrochromic element can stay in its colour changed state for some time. In summary, the transistors make control of the current applied to the electrochromic elements possible, and thereby also the selection of individual display cells to be switched. The skilled person may create a matrix of electrochemical pixel devices according to the invention, having any number of pixels without undue experimentation, using the teachings herein. Specific embodiments showing alternative matrix designs and variants of the electrochemical pixel device to be used in such matrices are shown in the detailed description below. Especially, the electrochemical transistor devices A in the pixels forming part of such a matrix may have one or two electrodes for supply of gate voltage to the transistor channel. Different, characteristics are obtained in the different cases, as explored in further detail below. Briefly, a design having two gate electrodes generally provides for better control of the currents in the matrix system. However, a design of only one gate electrode prevents cross-talk between the second gate electrodes of all the pixels in a row, which may occur as a disadvantage in the two-gate design. The one-gate design also makes for fewer crossings of conductors. The problem of cross-talk between gate electrodes in a row may also be addressed by the provision of resistances, which prevent the current from a certain pixel from spreading to other pixels in the same row.

The invention in a further aspect also extends to a pixelated display which comprises such a matrix of electrochemical pixel devices.

The electrochemical pixel device according to the invention is advantageous in that it can be easily realised on a support, such as polymer film or paper. Thus, the different components can be deposited on the support by means of conventional printing techniques such as screen printing, offset printing, ink-jet printing and flexographic printing, or coating techniques such as knife coating, doctor blade coating, extrusion coating and curtain coating, such as described in "Modern Coating and Drying Technology" (1992), eds E D Cohen and E B Gutoff, VCH Publishers Inc, New York, N.Y., USA. In those embodiments of the invention that utilise a polymer as the organic material in the electrochemical transistor device A or as the electrochromic material in the electrochromic device a (see below for materials specifications), this material can also be deposited through in situ polymerisation by methods such as electropolymerisation, UV-polymerisation, thermal polymerisation and chemical polymerisation. As an alternative to these additive techniques for patterning of the components, it is also possible to use subtractive techniques, such as local destruction of material through chemical or gas etching, by mechanical means such as scratching scoring, scraping or milling, or by any other subtractive methods known in the art. Yet another aspect of the invention provides such processes for the manufacture of an electrochemical pixel device from the materials specified herein.

According to a preferred embodiment of the invention, the electrochemical pixel device is encapsulated, in part or entirely, for protection of the device. The encapsulation retains any solvent needed for e g the solidified electrolyte to function, and also keeps oxygen from disturbing the electrochemical reactions in the device. Encapsulation can be achieved through liquid phase processes. Thus, a liquid phase polymer or organic monomer can be deposited on the device using methods such as spray-coating, dip-coating or any of the conventional printing techniques listed above. After deposition, the encapsulant can be hardened for example by ultraviolet or infrared irradiation, by solvent evaporation, by cooling or through the use of a two-component system, such as an epoxy glue, where the components are mixed together directly prior to deposition. Alternatively, the encapsulation is achieved through lamination of a solid film onto the electrochemical pixel device. In preferred embodiments of the invention, in which the components of the electrochemical pixel device are arranged on a support, this support can function as the bottom encapsulant. In this case encapsulation is made more convenient in that only the top of the sheet needs to be covered with liquid phase encapsulant or laminated with solid film.

Further objects and purposes of the present invention will be clear from the following drawings and detailed description of specific embodiments thereof. These specifications and drawings are intended as illustrations of the invention as claimed, and are not to be seen as limiting in any way.

BRIEF DESCRIPTION OF THE DRAWINGS

FIG. 8A shows a top view of the bottom layer only. FIG. 8B shows a top view of the middle layer only. FIG. 8C shows a top view of the top layer only. FIG. 8D is a cross section from the side showing the three layers of FIGS. 8A–8C stacked together to form the electrochemical pixel device matrix.

DESCRIPTION OF PREFERRED EMBODIMENTS

Definitions

Figure 1:
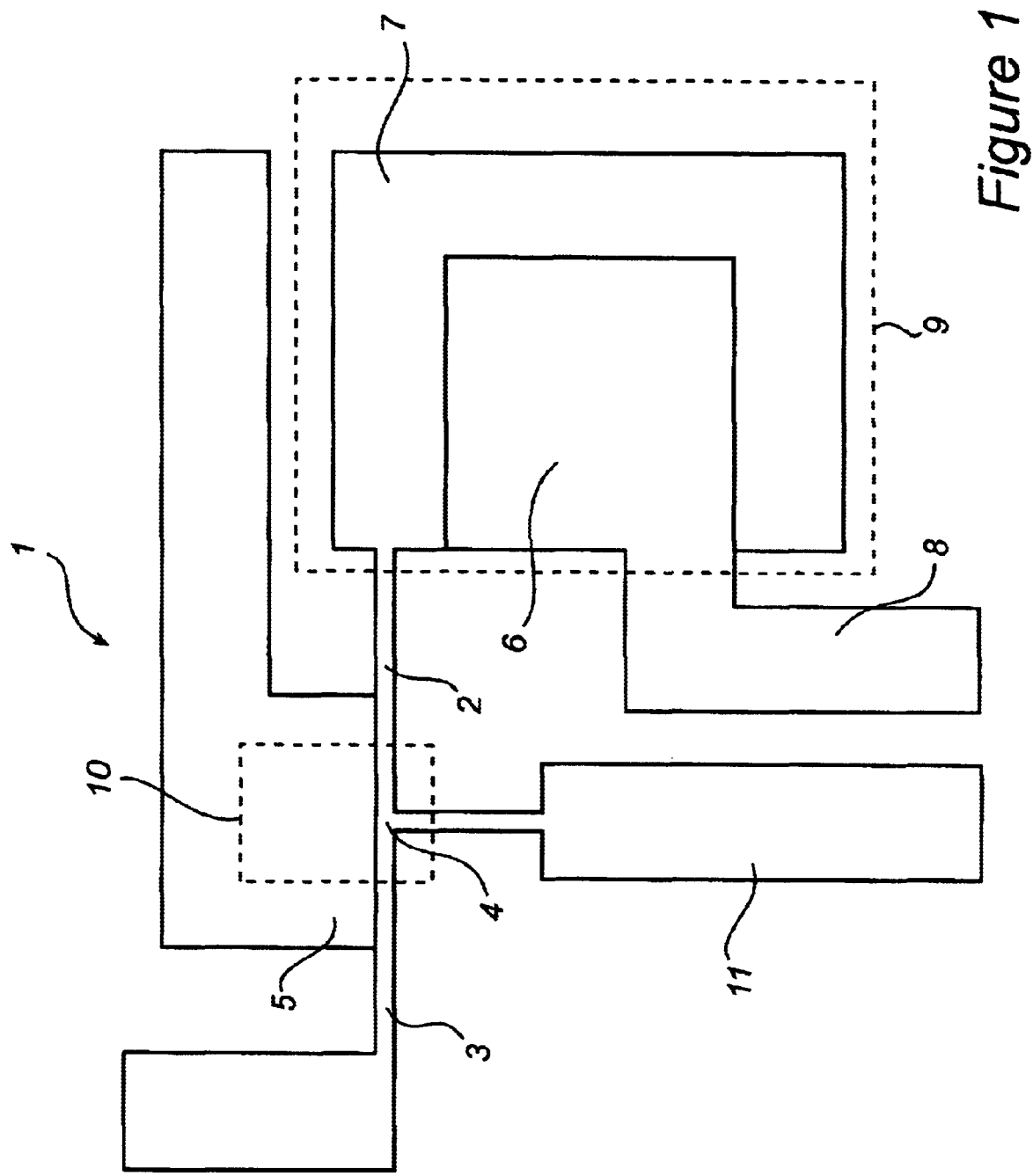
FIG. 1 shows a top view of elements of one embodiment of an electrochemical pixel device according to the invention.

Source contact: an electrical contact which provides charge carriers to a transistor channel.

Drain contact: an electrical contact which accepts charge carriers from a transistor channel.

Gate electrode: an electrical contact of which any fraction of the surface area is in direct electrical contact with solidified electrolyte, and therefore in ionic contact with the electrochemically active element.

Electrochemically active element: an "electrochemically active element" according to the present invention, is a piece of a material comprising an organic material having a conductivity that can be electrochemically altered through changing of the redox state of said organic material. The electrochemically active element is in ionic contact with at least one gate electrode via a solidified electrolyte. The electrochemically active element may furthermore be integrated with each of the source and drain contacts individually or with both of them, being composed of the same or different materials. The electrochemically active element in the electrochemical transistor device A in the electrochemical pixel device of the invention comprises a transistor channel.

Transistor channel: the "transistor channel" of the electrochemically active element establishes electrical contact between source and drain contacts.

Redox sink volume: in certain embodiments of the electrochemical transistor device A, the electrochemically active element further comprises a "redox sink volume". This is a part of the electrochemically active element adjacent to and in direct electrical contact with the transistor channel, which can provide or accept electrons to or from the transistor channel. Thus, any redox reactions within the transistor channel are complemented by opposing reactions within the redox sink volume.

Redox state: when reference is made to changes in the "redox state" of the electrochemically active element or electrochromic element, this is intended to include cases where the material in the element is either oxidised or reduced, as well as cases where there is a redistribution of charges within the element, so that one end is reduced and the other end is oxidised. In the latter case, the element as a whole retains its overall redox state, but its redox state has nevertheless been changed according to the definition used herein, due to the internal redistribution of charge carriers.

Electrochromic element: an "electrochromic element" in the devices of the invention is continuous geometrical body, which can be patterned to different shapes, and is composed of one material or a combination of materials. The material (s) may be organic or inorganic, molecular or polymeric. Such an electrochromic element, whether it is composed of one material or is, an ensemble of more than one material, combines the following properties: at least one material is electrically conducting in at least one oxidation state, and at least one material is electrochromic, i e, exhibits colour change as a result of electrochemical redox reactions within the material.

Solidified electrolyte: for the purposes of the invention, "solidified electrolyte" means an electrolyte, which at the temperatures at which it is used is sufficiently rigid that particles/flakes in the bulk therein are substantially immobilised by the high viscosity/rigidity of the electrolyte and that it doesn't flow or leak. In the preferred case, such an electrolyte has the proper rheological properties to allow for the ready application of this material on a support in an integral sheet or in a pattern, for example by conventional printing methods. After deposition, the electrolyte formulation should solidify upon evaporation of solvent or because of a chemical cross-linking reaction, brought about by additional chemical reagents or by physical effect, such as irradiation by ultraviolet, infrared or microwave radiation, cooling or any other such. The solidified electrolyte preferably comprises an aqueous or organic solvent-containing gel, such as gelatine or a polymeric gel. However, solid polymeric electrolytes are also contemplated and fall within the scope of the present invention. Furthermore, the definition also encompasses liquid electrolyte solutions soaked into, or in any other way hosted by, an appropriate matrix material, such as a paper, a fabric or a porous polymer. In some embodiments of the invention, this material is in fact the support upon which the electrochemical pixel device is arranged, so that the support forms an integral part of the operation of the device.

Electrodes: "electrodes" in devices according to the invention are structures that are composed of an electrically conducting material. Such electrodes allow the application of an external voltage to electrolyte, whereby an electric field within the solidified electrolyte is sustained for a time period long enough for the desired electrochemical reactions to occur.

Direct electrical contact: Direct physical contact (common interface) between two phases (for example electrode and electrolyte) that allows for the exchange of charges through the interface. Charge exchange through the interface can comprise transfer of electrons between electrically conducting phases, transfer of ions between ionically conducting phases, or conversion between electronic current and ionic current by leans of electrochemistry at an interface between for example electrode and electrolyte, electrolyte and electrochromic element, or electrolyte and electrochemically active element, or by occurrence of capacitive currents due to the charging of the Helmholtz layer at such an interface.

Colour change: when reference as made to "colour change", this is also meant to include changes in optical density or reflectance, so that "colour change" for example takes into account changes from blue to red, blue to colourless, dark green to light green, grey to white or dark grey to light grey alike.

Materials

Preferably, the solidified electrolyte in either or both of the electrochemical transistor device A and the electrochromic device B comprises a binder. It is preferred that this binder have gelling properties. The binder is preferably selected from the group consisting of gelatine, a gelatine derivative, polyacrylic acid, polymethacrylic acid, poly(vinylpyrrolidone), polysaccharides, polyacrylamides, polyurethanes, polypropylene oxides, polyethylene oxides, poly(styrene sulphonic acid) and poly(vinyl alcohol) and salts and copolymers thereof; and may optionally be cross-linked. The solidified electrolyte preferably further comprises an ionic salt, preferably magnesium sulphate if the binder employed is gelatine. The solidified electrolyte preferably further contains a hygroscopic salt such as magnesium chloride to maintain the water content therein.

The organic material for use in the electrochemical transistor device A in the electrochemical pixel device of the present invention preferably comprises a polymer which is electrically conducting in at least one oxidation state and optionally further comprises a polyanion compound. Organic materials comprising combinations of more than one polymer material, such as polymer blends, or several layers of polymer materials, wherein the different layers consist of the same polymer or different polymers, are also contemplated. Conductive polymers for use in the electrochemical transistor device of the invention are preferably selected from the group consisting of polythiophenes, polypyrroles, polyanilines, polyisothianaphthalenes, polyphenylene vinylenes and copolymers thereof such as described by J C Gustafsson et al in Solid State Ionics, 69, 145–152 (1994); Handbook of Oligo- and Polythiophenes, Ch 10.8, Ed D Fichou, Wiley-VCH, Weinhem (1999); by P Schottland et al in Macromolecules, 33, 7051–7061 (2000); Technology Map Conductive Polymers, SRI Consulting (1999); by M Onoda in Journal of the Electrochemical Society, 141, 338–341 (1994); by M Chandrasekar in Conducting Polymers, Fundamentals and Applications, a Practical Approach, Kluwer Academic Publishers, Boston (1999); and by A J Epstein et al in Macromol Chem, Macromol Symp, 51, 217–234 (1991). In an especially preferred embodiment, the organic material is a polymer or copolymer of a 3,4-dialkoxythiophene, in which said two alkoxy groups may be the same or different or together represent an optionally substituted oxyalkylene-oxy bridge. In the most preferred embodiment, the polymer is a polymer or copolymer of a 3,4-dialkoxythiophene selected from the group consisting of poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythiophene), poly(3,4-butylenedioxythiophene) derivatives, and copolymers therewith. The polyanion compound is then preferably poly (styrene sulphonate).

In preferred embodiments, the electrochromic element for use in the electrochromic device: B in the electrochemical pixel device of the present invention comprises, as electrochromic material, an electrochromic polymer which is electrically conducting in at least one oxidation state, and optionally also comprises a polyanion compound. Electrochromic polymers for use in the electrochromic element of the electrochromic device of the invention are preferably selected frog the group consisting of electrochromic polythiophenes, electrochromic polypyrroles, electrochromic polyanilines, electrochromic polyisothianaphthalenes, electrochromic polyphenylene vinylenes and copolymers thereof, such as described by J C Gustafsson et al in Solid State Ionics, 69, 145–152 (1994); Handbook of Oligo- and Polythiophenes, Ch 10.8, Ed D Fichou, Wiley-VCH, Weinhem (1999); by P Schottland Ad et al in Macromolecules, 33, 7051–7061 (2000); Technology Map Conductive Polymers, SRI Consulting (1999); by M Onoda in Journal of the Electrochemical Society, 141, 338–341 (1994); by M Chandrasekar in Conducting Polymers, Fundamentals and Applications, a Practical Approach, Kluwer Academic Publishers, Boston (1959); and by A J Epstein et al in Macromol Chem, Macromol Symp, 51, 217–234 (1991). In a preferred embodiment, the electrochromic polymer is a polymer or copolymer of a 3,4-dialkoxythiophene, in which said two alkoxy groups may be the same or different or together represent an optionally substituted oxy-alkylene-oxy bridge. In the most preferred embodiment, the electrochromic polymer is a polymer or copolymer of a 3,4-dialkoxythiophene selected from the group consisting of poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythiophene), poly(3,4-butylenedioxythiophene) derivatives, and copolymers therewith. The, polyanion compound is then preferably poly(styrene sulfonate). As is readily appreciated by the skilled man, in alternative embodiments of the invention, the electrochromic material comprises any non-polymer material, combination of different non-polymer materials, or combination of polymer materials with non-polymer materials, which exhibit conductivity in at least one oxidation state as well as electrochromic behaviour. Electrochromic elements comprising combinations of more than one polymer material, such as polymer blends, or several layers of electrochromic materials, wherein the different layers consist of the same material or different materials, e g one layer each of two different electrochromic polymers, are also contemplated.

For example, one could use a composite of an electrically conducting material and and electrochromic material, such as electrically conductive particles such as tin oxide, ITO or ATO particles with polymer or non-polymer electrochromic materials such as polyaniline, polypyrrole, polythiophene, nickel oxide, polyvinylferrocene, polyviologen, tungsten oxide, iridium oxide, molybdenum oxide and Prussian blue (ferric ferrocyanide). As non-limiting examples of electrochromic elements for use in the device of the invention, mention can be made of: a piece of PEDOT-PSS, being both conducting and electrochromic, a piece of PEDOT-PSS with $Fe^{2+}/SCN^-$, PEDOT-PSS being conducting and electrochromic and $Fe^{2+}/SCN^-$ being an additional electrochromic component (see below); a piece composed of a continuous network of conducting ITO particles in an insulating polymeric matrix, in direct electrical contact with an electrochromic $WO_3$-coating; a piece composed of a continuous network of conducting ITO particles in an insulating polymeric matrix, in contact with an electrochromic component dissolved in an electrolyte.

Some embodiments of the invention comprise a further electrochromic material for realisatlon of pixel devices with more than one colour. This further electrochromic material can be provided within the electrochromic element or the solidified electrolyte of the electrochromic device B, which then for example comprises an electrochromic redox system, such as the redox pair of colourless $Fe^{2+}$ and $SCN^-$ ions on one hand, and of red $Fe^{3+}$ (SCN) $(H_2O)_5$ complex on the other. By way of further, non-limiting example, such materials may be selected from different phenazines such as DMPA—5,10-dihydro-5,10-diethylphenazine, DEPA—5,10-dihyoro-5,10-diethylphenazine, and DOPA—5,10-dihydro-5,10-dioctylphenazine, from TMPD—N,N,N',N'-tetramethylphenylenediamine, TMBZ—N,N,N',N'-tetramethylbenzidine, TTF—tetrathiafulvalene, phenanthroline-iron complexes, erioglaucin A, diphenylamines, p-ethoxychrysoidine, methylene blue, different-indigos and phenosafranines, as well as mixtures thereof.

As described above, the electrochromic device B in the electrochemical pixel device of the invention may comprise a redox active material for reasons other than additional colouring effects. This redox active material may be the same or different from any of the further electrochromic materials listed immediately above. Thus, any suitable anti-oxidant or anti-reductant may be used, for example organic substances like vitamin C, alcohols, polyalcohols (e g glycerol) or sugars, the alcohols, polyalcohols or sugars where appropriate being present at a high pH, conjugated polymers, oliomers and single molecules; inorganic substances like salts comprising species that may be oxidised (e g $Fe^{2+}$ to $Fe^{3+}$, $Sn^{2+}$ to $Sn^{4+}$), metal clusters (e g a Cu cluster or a Fe cluster), or salts comprising species that may be reduced (e g $Fe^{3+}$ to $Fe^{2+}$, $Sn^{4+}$ to $Sn^{2+}$); metal organic complexes like ferrocenes, phthalocyanines, metalloporphyrines.

In electrochemical pixel devices of the invention, it is preferred both that the organic material in the electrochemical transistor device A is a polymer and that the electrochromic material in the electrochromic device B comprises an electrochromic polymer. In the most preferred case, the electrochromic polymer in the electrochromic device B is the same material as the polymer in the electrochemical transistor device A.

The support in some embodiments of the electrochemical pixel device of the present invention is preferably selected from the group consisting of polyethylene terephthalate; polyethylene naphthalene dicarboxylate; polyethylene; polypropylene; paper; coated paper, e g coated with resins, polyethylene, or polypropylene; paper laminates; paperboard; corrugated board; glass and polycarbonate. The support is also preferably reflective.

Embodiment of an Electrochemical Pixel Device

A typical electrochemical pixel device according to an embodiment of the invention is shown schematically in FIG. 1. The electrochemical pixel device 1 is constructed through patterning of a suitable material (see above), and comprises an electrochemical transistor device (2–5, 10–11) and an electrochromic device (6–9). The electrochemical transistor device comprises a source contact 2 and a drain contact 3. Between, and in direct electrical contact with, the source and drain contacts is arranged an electrochemically active element 4, the conductivity of which may be altered through application of a gate voltage to a positive gate electrode 5. The electrochemically active element 4 and part of the positive gate electrode 5 are covered with a layer of solidified electrolyte 10. In this embodiment, the source and drain contacts 2, 3 and the electrochemically active element 4 are all formed by a continuous piece of the material. This piece is separated by a narrow gap from the gate electrode 5, so that there is no direct electrical contact between the electrochemically active tact between the electrochemically active element 4 and the gate electrode 5.

The electrochromic device comprises an electrochromic element 6, as well as two electrodes 7, 8, covering the electrochromic element 6 and the first electrode 7 is a layer of solidified electrolyte 9. There is no direct electrical contact between the first electrode 7 and the electrochromic element 6, but between the electrochromic element 6 and the second electrode 8. The first electrode 7 of the electrochromic device is in direct electrical contact with, or rather coincides with, the source contact 2 of the electrochemical transistor device.

Upon function of the electrochemical pixel device 1, a colouring or decolouring current is supplied to the electrochromic element 6 through application of a voltage between drain contact 3 and electrode 8, corresponding to a drain-source-voltage $V_{ds}$. The current actually supplied to the electrochromic element 6 is controlled by the conductivity in the electrochemically active element 4. This conductivity, in turn, is controlled by a gate voltage $V_g$ at the positive gate electrode 5. The gate voltage $V_g$ may, in certain embodiments, be applied between the positive gate electrode 5 and a second, negative gate electrode 11, which may or may not be it direct electrical contact with the electrochemically active element 4. Alternatively, the gate voltage is applied between the positive gate electrode 5 and either of the source contact 2 or the drain contact 3.

In an experiment using this embodiment of an electrochemical pixel device according to the invention, the device was manufactured as follows: a starting material of Orgacon™ foil, commercially available from Agfa and comprising the conducting and elect ochromic polymer PEDOT-PSS (poly-(3,4-ethylendioxythiophene) doped with polystyrene sulfonate)) was used. Patterning of the PEDOT-PSS substrate was done using a plotter tool equipped with a scalpel. The electrolyte used was commercially available Blagel™ from Apoteksbolaget, Sweden. The gel was applied using silk-screen printing with a 45 $\mu$m thick, patterned vinyl foil as template. Alternatively, 10% hydroxy ethyl cellulose in water may be used as the electrolyte gel.

PEDOT-PSS is a material that exhibits a very light, pale blue colour and good conductivity in its native, partly oxidised state. When the PEDOT-PSS is reduced, its conductivity diminishes greatly, and the material is coloured deeply blue. In such PEDOT-PSS pixel devices as the one described immediately above, having an architecture as shown in FIG. 1, the electrochromic device B is typically driven with $V_{ds}$ voltages between 1.5 and 2 V, and the display area varies between 1 and 2 cm$^2$. The electrochromic element 6 in this case is reduced and switched to a deep blue colour. An electrode 7 that is oxidised also exists, otherwise the electrochromic element might be destroyed by over-oxidation. This counter-electrode is not always convenient, since it diminishes the active display area, but an approach to design a vertical architecture instead of the lateral design shown in FIG. 1 has been explored in order to solve this problem (see below in the description related to FIGS. 8A–8D).

In experiments with the PEDOT-PSS pixel, the current passing through the electrochromic device was about 200–300 $\mu$A in the beginning, at a $V_{ds}$ of 2 V and an electrochromic element area of 1–2 cm$^2$. After approximately 10 s it was fully switched and saturated. The current flowing through the electrochromic device in this saturated state was around 50 $\mu$A. The reason for this current even in the reduced, non-conducting state of PEDOT-PSS is leakage from the display cell.

In these experiments, the electrochemical transistor device was driven by gate voltages between 0 and 1.5 V. At a gate voltage of 0 V, the electrochemically active element was fully conducting, and at 1.5 V, it was in its "off" state. Already at 0.3–0.4 V it was evident from the appearance of blue colouring that the transistor channel was being reduced, which corresponds to an increased resistance. The resistance in the transistor channel was approximately around 10 k$\Omega$ in its conducting state, which corresponded to a current of 200 $\mu$A it 2 V. In the cut-off state, at gate voltages of around 1.5 V, the resistance was greatly increased. Current values of around 200 nA were reached, corresponding to a resistance of 10 M$\Omega$. The on/off-ratio for the electrochemical transistor device part of the electrochemical pixel device was thus 1000 in this case. Furthermore, extreme on/off-ratios of 10$^5$ in the electrochemical transistor were reached with components made in alternative ways.

Some working characteristics of this electrochemical pixel device:

The transistor channel was conducting at a gate voltage, $V_g$, of 0 V, and substantially non-conducting at a $V_g$ of 1 V.

If already reduced, i e deep blue, the electrochromic element decoloured at a $V_{ds}$ if 0 V, otherwise nothing happened. At a $V_{ds}$ of 2 V, electrochemistry occurred, and the electrochromic element changed to its reduced, deep blue state, and remained in this state as long as the voltage was applied.

Effects of four possible combinations of voltages applied to the pixel:

$V_g$=0 V, $V_{ds}$=0 V; nothing happens, or the pixel decolours if it was reduced from the beginning.

$V_g$=0 V, $V_{ds}$=2 V; colours the pixel, which then remains in this state.

$V_g$=1 V, $V_{ds}$=0 V; the transistor channel is rendered non-conducting. If the pixel is already reduced, the increased impedance in the channel keeps the charges inside the pixel area.

$V_g$=1 V, $V_{ds}$=2 V; nothing happens.

Figure 2:
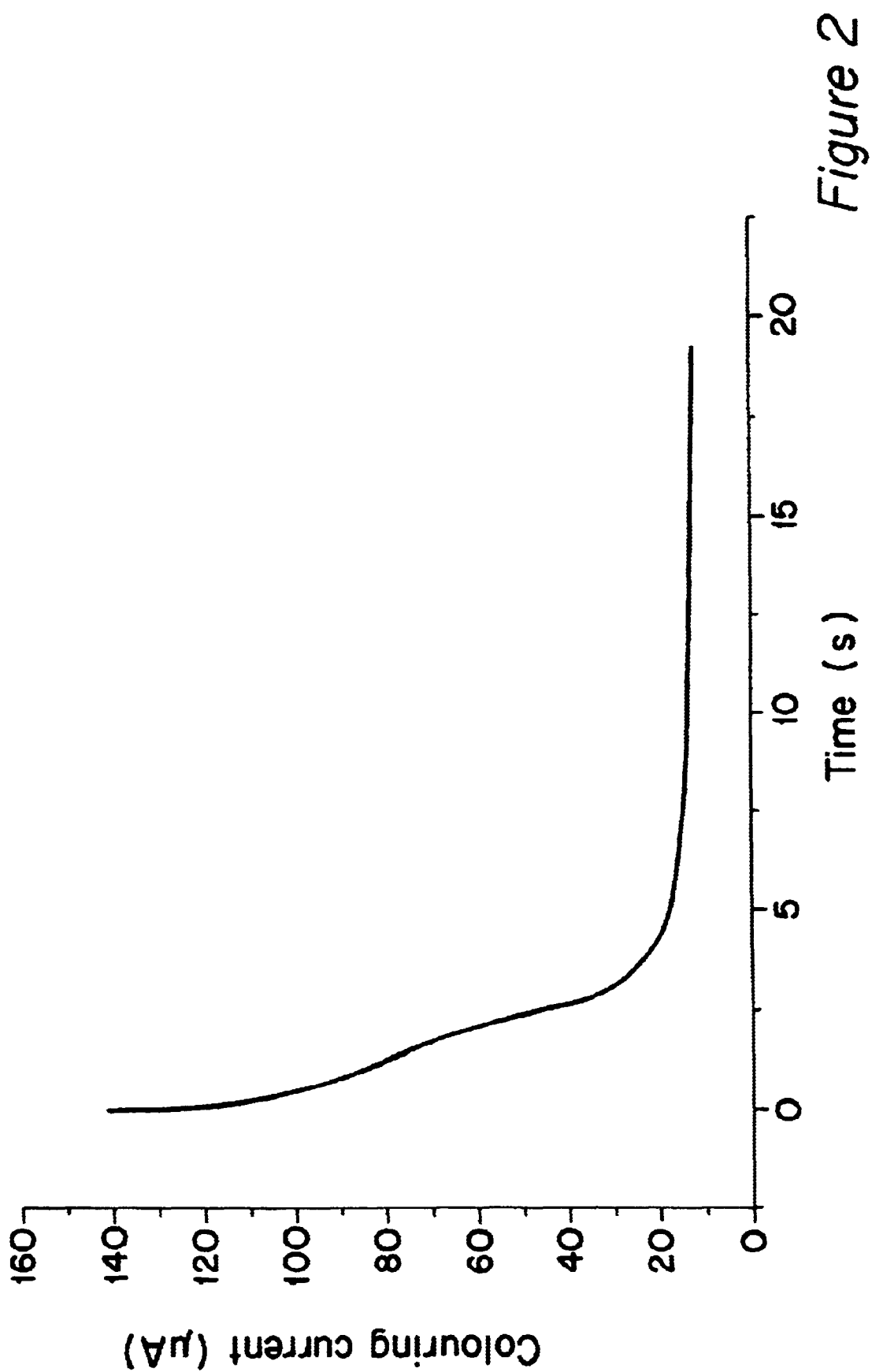
FIG. 2 is a diagram showing current during colouring of a pixel as shown in FIG. 1. $V_{ds}=2$ V, $V_g=0$ V.
Figure 3:
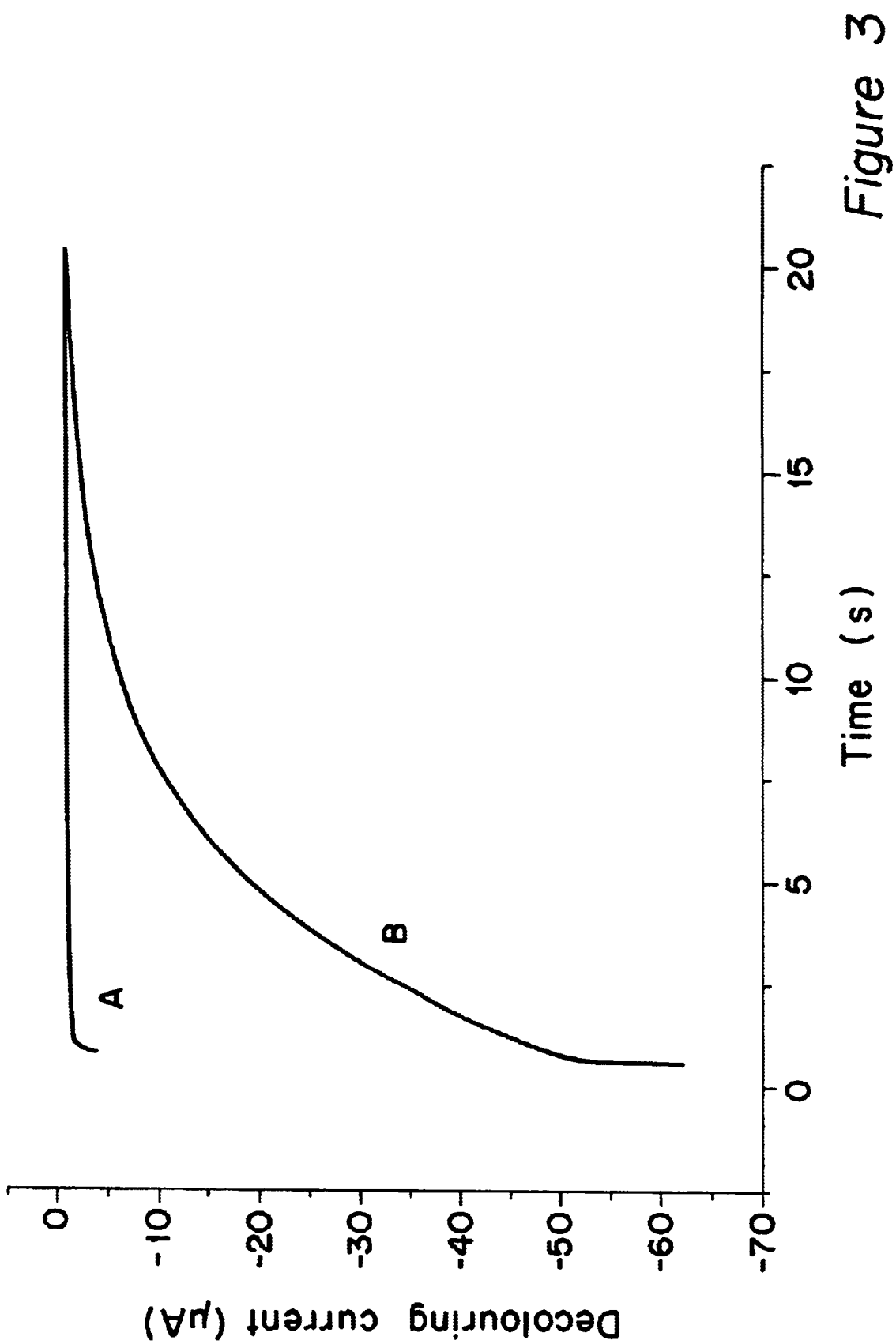
FIG. 3 is a diagram showing currents during decolouring of a pixel as shown in FIG. 1. A: $V_g=1.4$ V. B: $V_g=0$ V.
Figure 4:
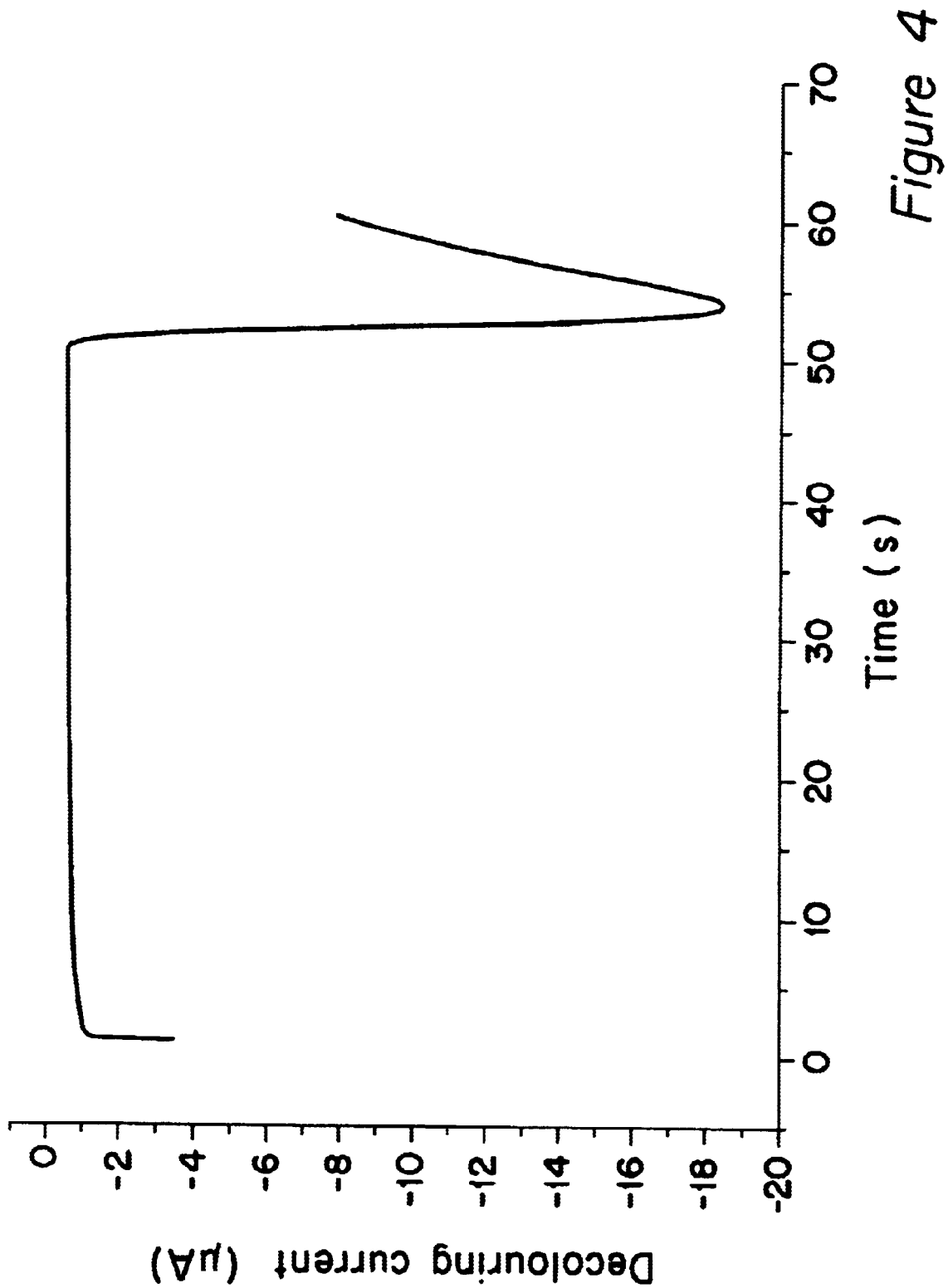
FIG. 4 is a diagram showing current during decolouring of a pixel as shown in FIG. 1. $V_g 1$, 4 V during the first 50 seconds, thereafter $V_g 0$ V.

FIGS. 2–4 are diagrams of measurements performed on a PEDOT-PSS pixel device with the design shown in FIG. 1. FIG. 2 shows colouring of the electrochromic device using a $V_{ds}$ of 2 V. The transistor channel was in the "on" state, i e $V_g$=0 V. The current through the channel was about 150 $\mu$A at the outset, and then decreased because of the reduction to a non-conducting state of the electrochromic element in the display cell. The electrochromic element area in this measurement was 64 mm$^2$, and the area of the counter-electrode was 90 mm$^2$. After about five seconds, the pixel was fully switched.

FIG. 3 is a diagram showing decolouring of a pixel in two different cases. The upper curve, A, corresponds to the current from the electrochromic element at a $V_g$ of 1.4 V, i e with the transistor channel closed. The lower curve, B, shows the current from the electrochromic element at a $V_g$ of 0 V, i e with the transistor channel open.

FIG. 4 shows decolouring of one pixel at different values of $V_g$. The transistor channel was closed ($V_g$=1.4 V) for the first 50 s, whereupon it was opened ($V_g$0 V) for the last 10 s. After 50 s of decolouring with a closed transistor channel, there were still a lot of charges in the electrochromic element, as evident from FIG. 4. When the transistor channel was opened, i e the gate voltage was set to 0 V, a decolouring current peak occurred. The size of this peak was almost 20 $\mu$A, which shall be compared to the few hundred nA of leak current when the channel was closed.

Lateral Matrices of Electrochemical Pixel Devices

Several different matrices of electrochemical pixel devices have been realised, using the same materials as in the electrochemical pixel device embodiment described in the previous section.

Figure 5:
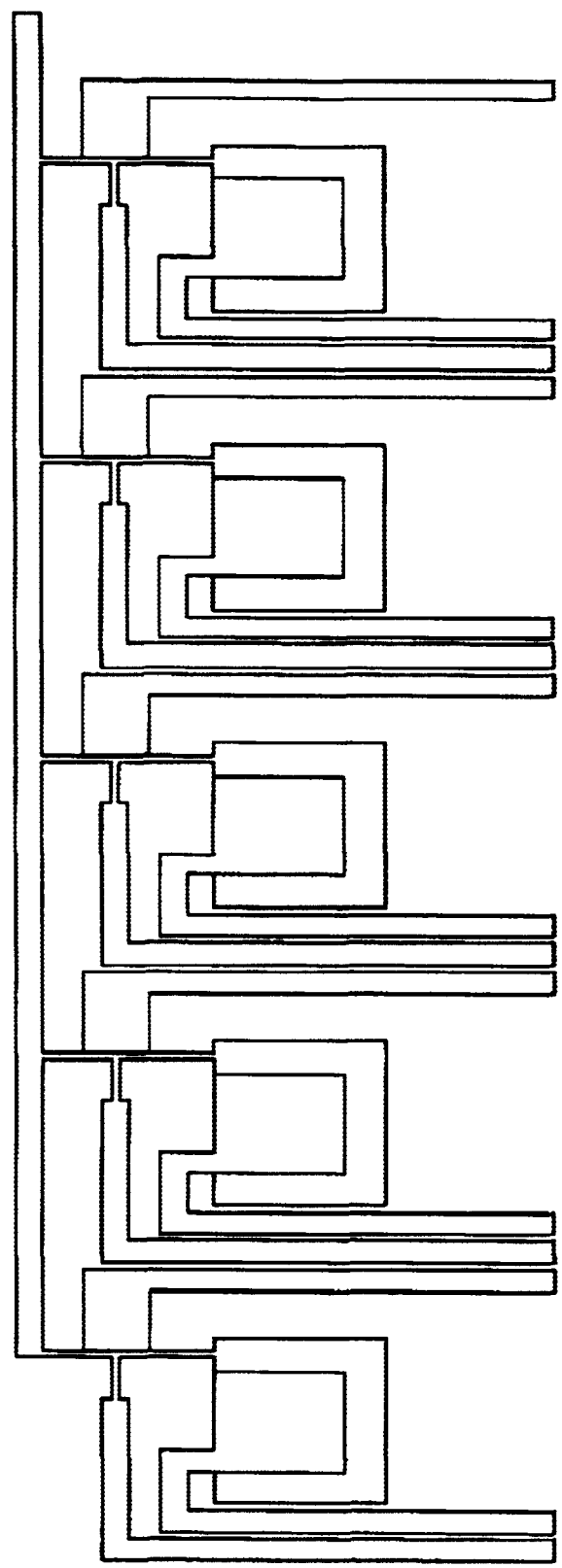
FIG. 5 shows a top view of a 5×1 matrix of electrochemical pixel devices like the one shown in FIG. 1.

Shown in FIG. 5 is a column of five such pixels, or a 5×1 matrix, Using the reference numerals of FIG. 1, the drain contact 3 of each of the five pixels is connected to a conductor for simultaneous application of $V_{ds}$ to all pixels. The gate electrodes 5 and 11 are, in contrast, arranged so that an individual gate voltage may be applied to each of the pixels independently.

Figure 6:
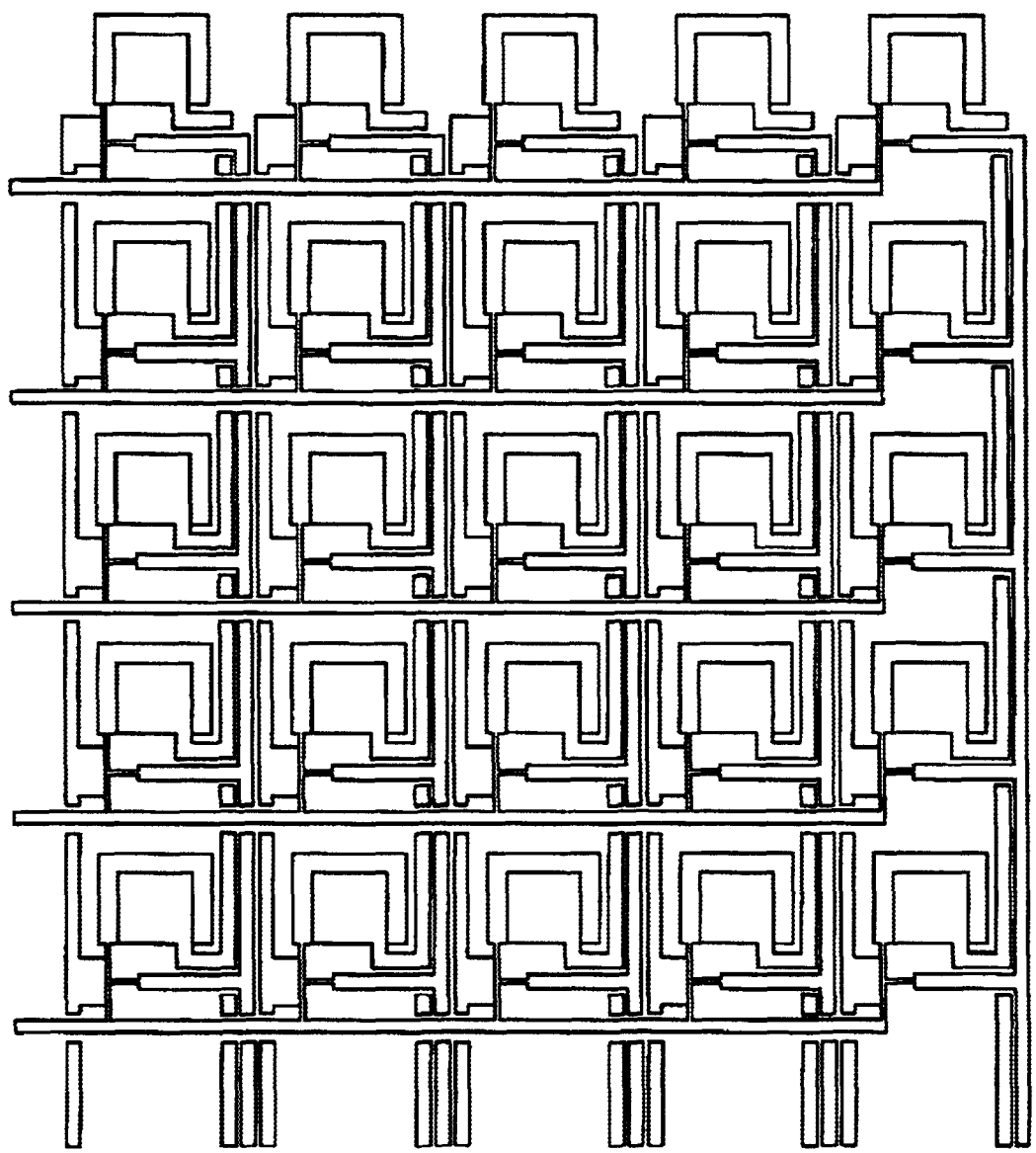
FIG. 6 shows a top view of a 5×5 matrix of electrochemical pixel devices like the one shown in FIG. 1.

A more complex and also more useful matrix of electrochemical pixel devices is shown in FIG. 6. Here, five columns of five pixels are combined in a 5×5 matrix. The contacts to the rows and columns, enable application of a colouring or decolouring $V_{ds}$ to one column at the time, while the gate electrodes of the transistors are connected so as to enable application of $V_g$, and thus setting to "on" or "off", of all transistors in one row independently of the transistors in the other rows.

Figure 7:
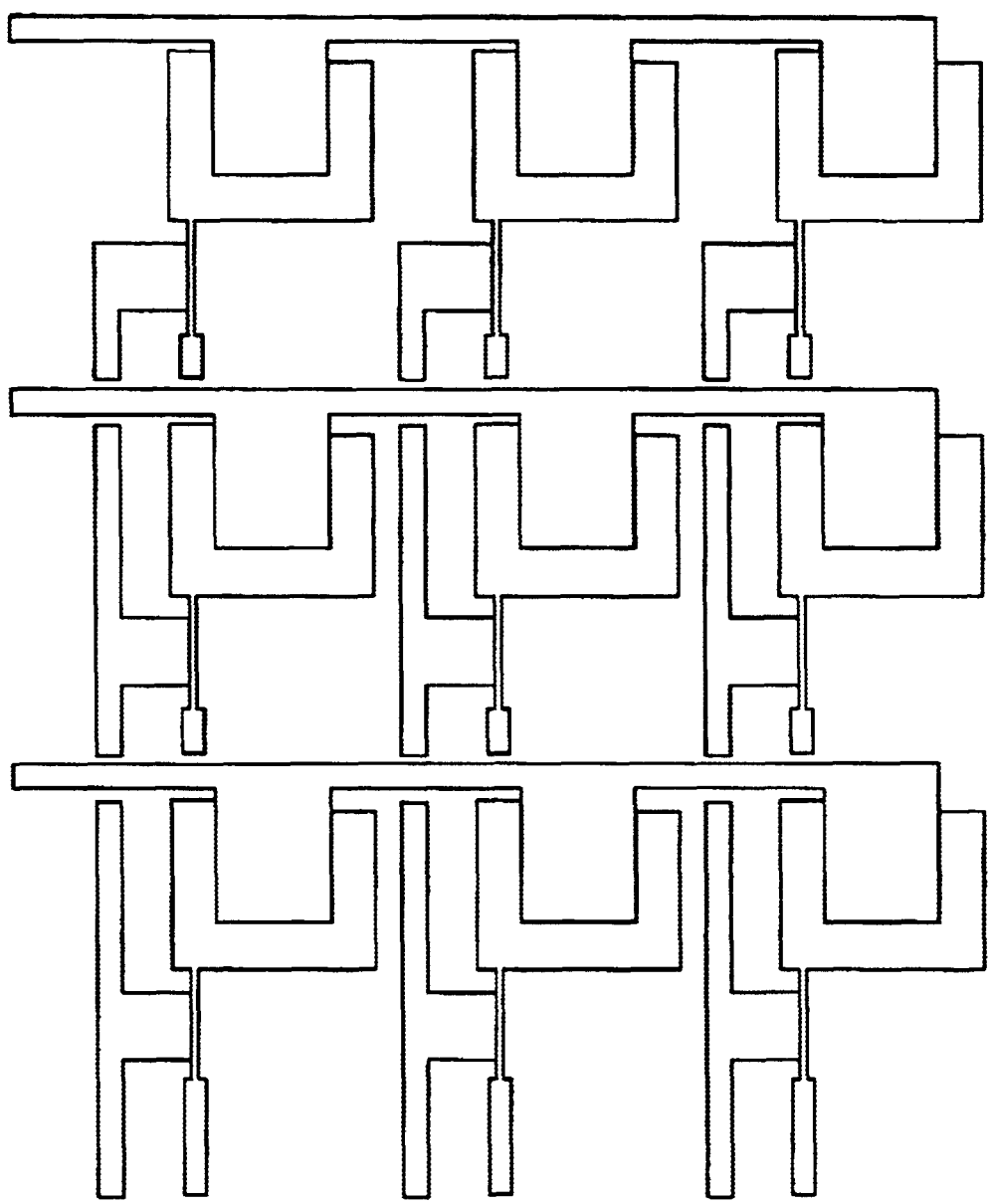
FIG. 7 shows a top view of a 3×3 matrix of electrochemical pixel devices according to another embodiment of the invention.

For simplification of design, in order to minimise the number of crossings between the conductors supplying current to the various electrodes and contacts, a variant of the electrochemical pixel device was used to form a 3×3 matrix, as illustrated in FIG. 7. In this variant, no negative gate electrode 11 is used, which means that one less conductor is needed. Furthermore, in matrices of devices that utilise two gate electrodes, there may occur problems with cross-talk between pixels through the conductors connecting the negative gate electrodes. The use of only one gate electrode per pixel device is one way of addressing this problem. Another alternative is to provide a resistance on each negative electrode 11 (this is illustrated in the context of a vertical matrix design below).

Vertical Matrix of Electrochemical Pixel Devices

Referring now to FIGS. 8A–8D, a 3×3 matrix of identical electrochemical pixel devices having a vertical design is shown. The matrix is formed from three different layers, and a sandwich structure of these layers put together makes up the ensemble of electrochemical pixel devices. The bottom layer I, shown in FIG. 8A, comprises the electrochemically active element 4 of each of the transistor devices. Also in this layer are positive (5) and negative (11) gate electrodes, and conductors connecting the gate electrodes of each row. In order to minimise cross-talk, the negative electrodes 11 have all been provided with a resistance, which is shown in the figures as a line interrupting each negative electrode 11. The source and drain contacts 2, 3 of the electrochemical transistor device and one electrode 7 of the electrochromic device are also present in this layer.

Figure 8A:
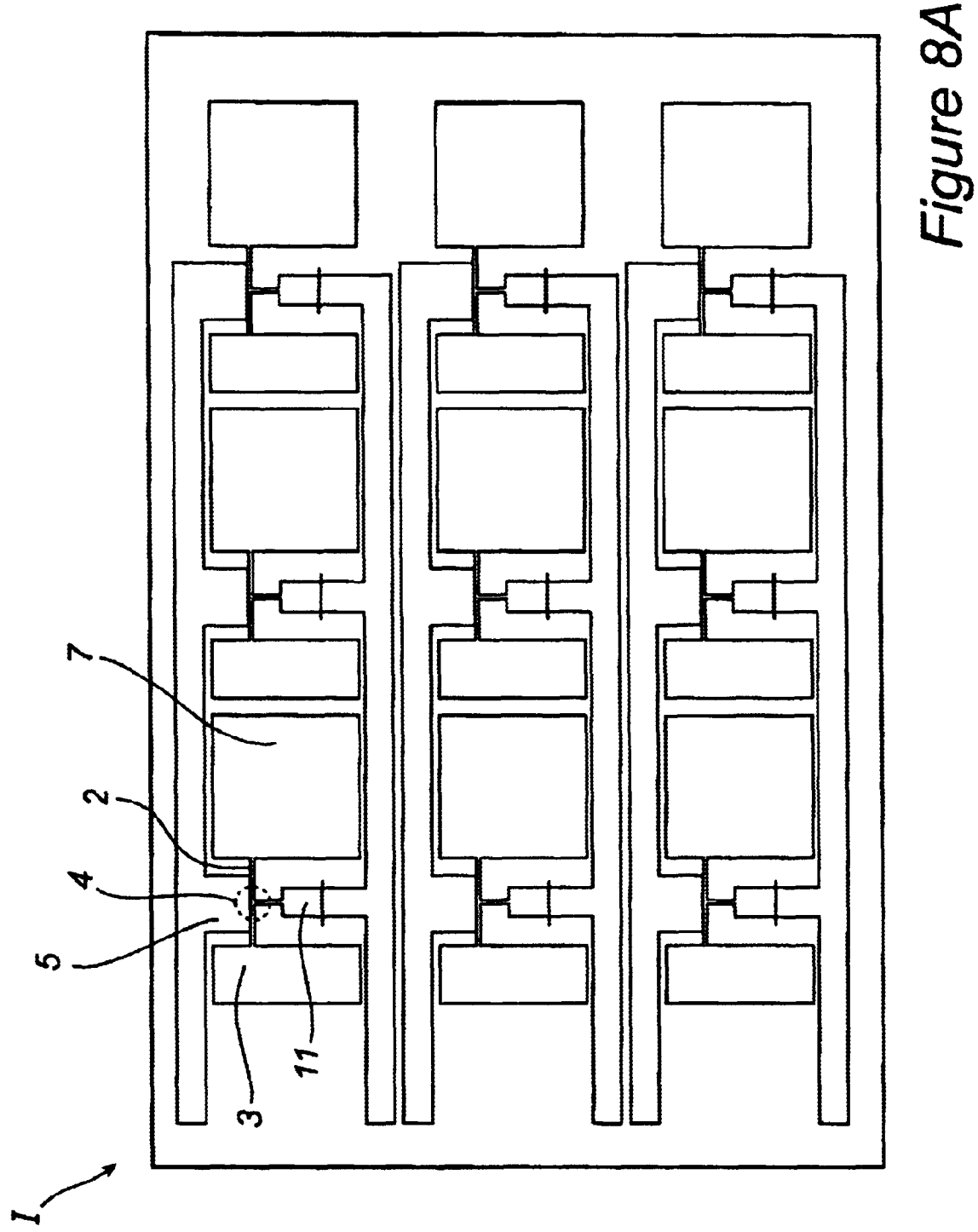
FIGS. 8A–8D illustrate an alternative design of a 3×3 matrix of electrochemical pixel devices according to another embodiment of the invention, having a vertical, three-layered design.
Figure 8B:
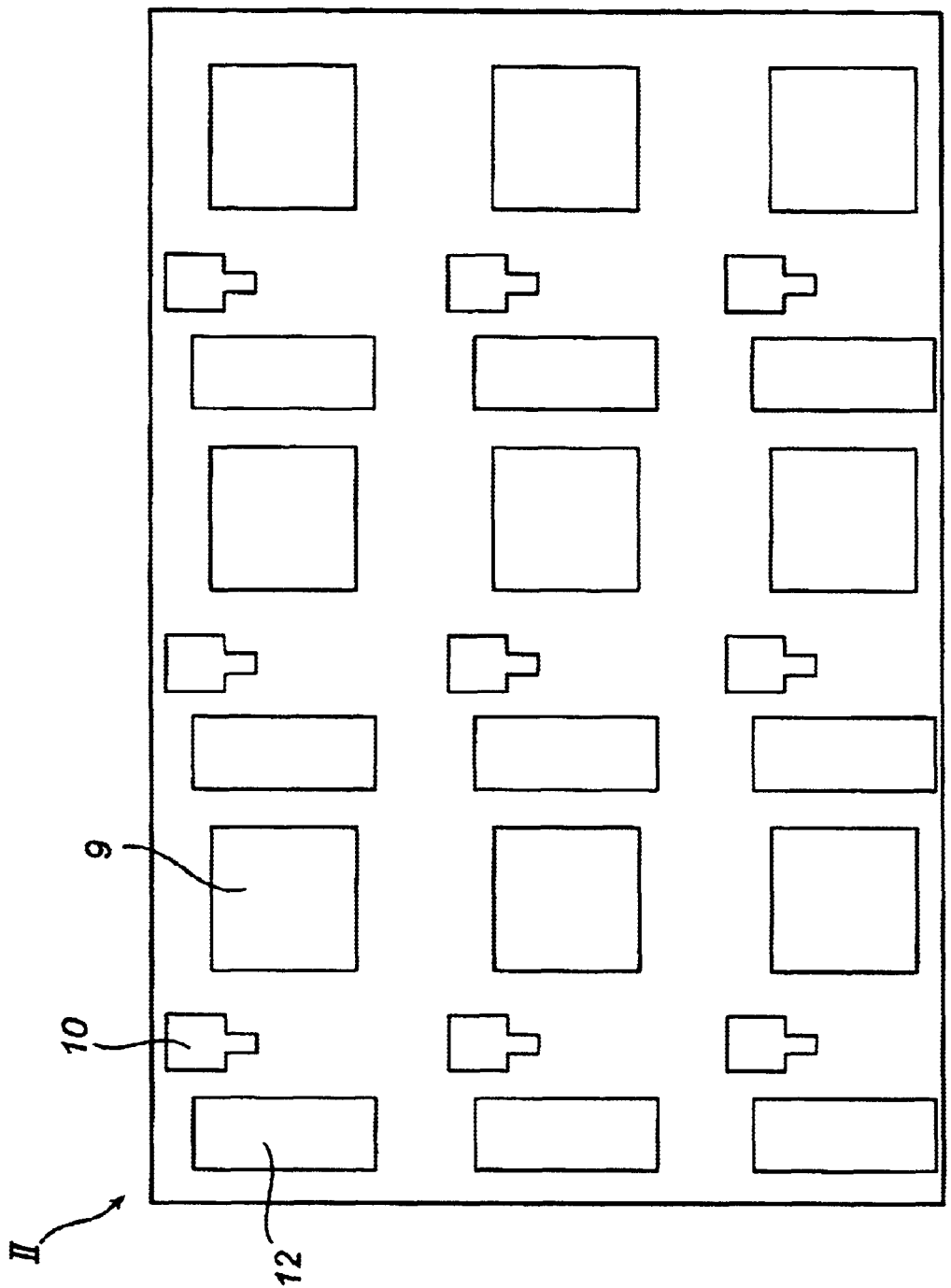

The middle layer II, or spacer layer, is shown in FIG. 8B. This layer comprises the elements of solidified electrolyte that are necessary for the electrochemical reactions in the electrochemical pixel device. Thus, the electrolyte 9 for the electrochromic device B is provided so that it contacts the electrode 7 of the bottom layer I and the electrochromic element 6 of the top layer III when the layers are put together. In the same fashion, the electrolyte 10 for the electrochemical transistor device A is provided so that it contacts the electrochemically active element 4 and the gate electrode 5 of the bottom layer when the layers are put together. The middle layer II also comprises vias 12, that are formed from an electrically conducting material and serve the purpose of mediating transport of charges to the drain contacts 3 of the bottom layer I from the top layer III, described next.

Figure 8C:
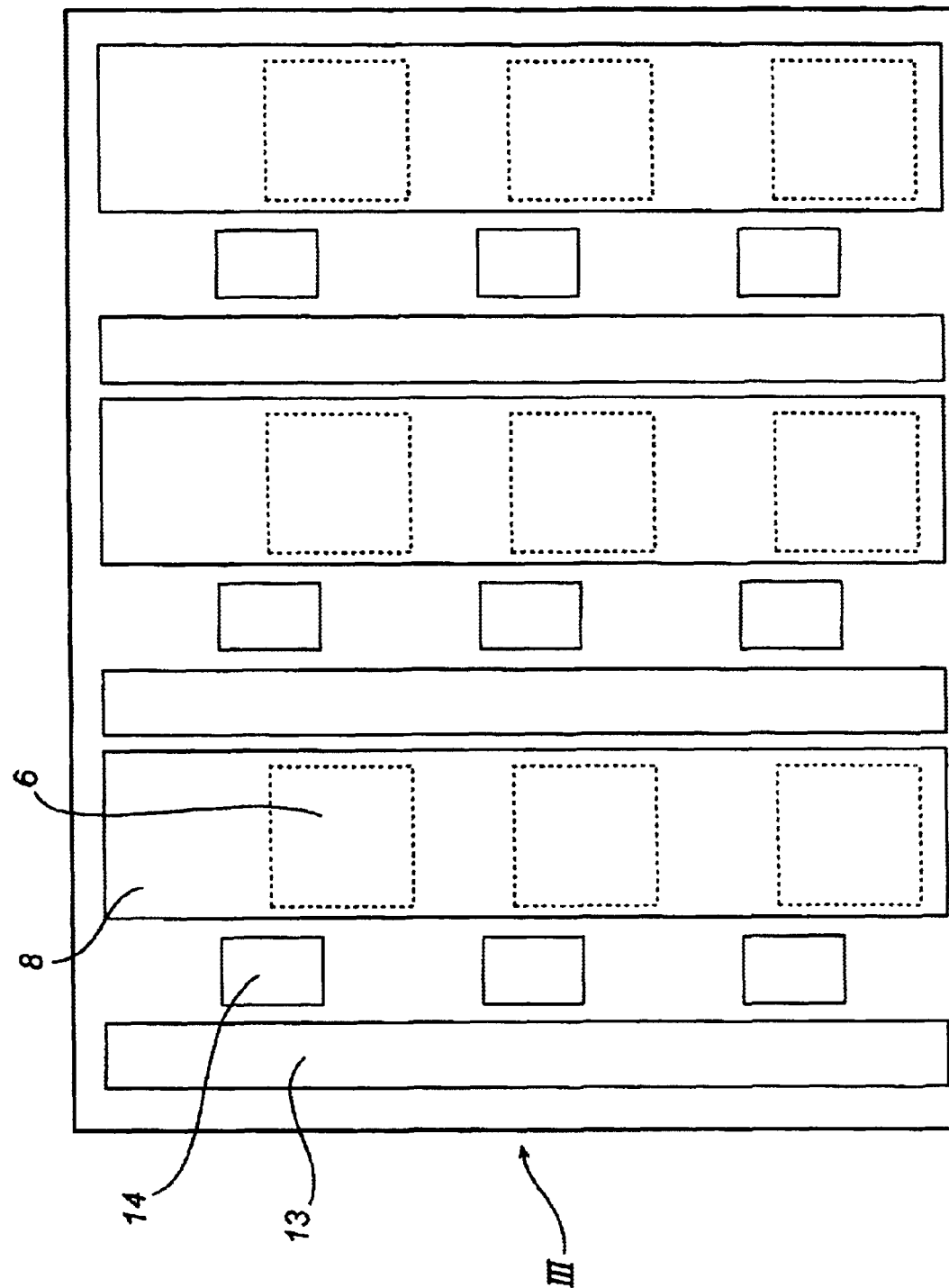

FIG. 8C illustrates the top layer III. In this layer, conductors 13 supply $V_{ds}$ to the top layer via the vials 12 of the middle layer. The bottom layer also comprises the electrochromic elements 6 of the vertical electrochromic devices. In this particular embodiment, the electrochromic elements 6 of all pixels in a column are formed from the same piece of electrochromic and conducting material, and the electrodes 8 for application of $V_{ds}$ to the electrochemical pixel devices in this column may be thought of as those parts of this piece that are not in contact with the gel electrolyte underneath. This arrangement makes possible the application of $V_{ds}$ to drains 3 and electrodes 8, in a fashion similar to the operation of the single, lateral electrochemical pixel device shown in FIG. 1. The top layer III also comprises areas 14, which have been made non-conducting or isolated, which are in contact with the electrochemical transistor device electrolytes 10 in the layer above and which serve the purpose of preventing leak currents from the electrochemically active elements 4.

Figure 8D:
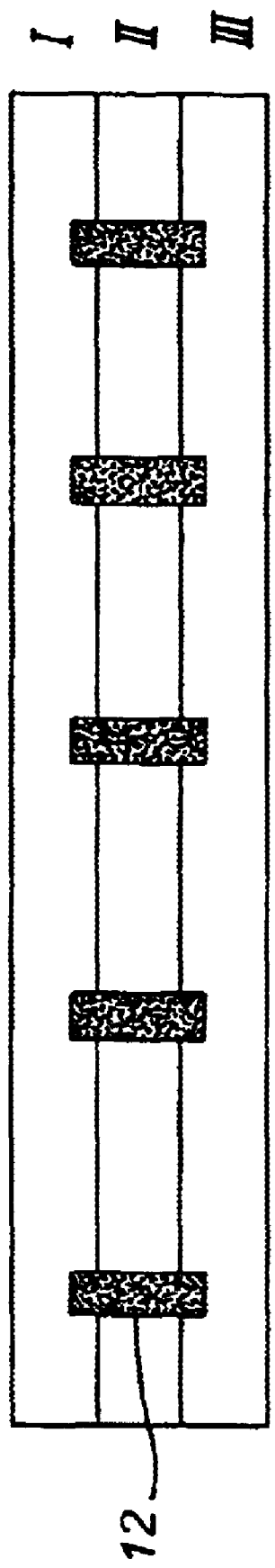

FIG. 8D is a simple sketch of the three layers taken together, which is primarily intended to illustrate the vias 12, which establish electrical contact between components of layers I and III.

What is claimed is:

1. A pixel device, which comprises the following components:
   (A) an electrochemical transistor device comprising: a source contact; a drain contact; at least one gate electrode; an electrochemically active element arranged between, and in direct electrical contact with, the source and drain contacts, which electrochemically active element comprises a transistor channel and is of a material comprising an organic material having the ability of electrochemically altering its conductivity through change of redox state thereof; and a solidified electrolyte in direct electrical contact with the electrochemically active element and said at least one gate electrode and interposed between them in such a way that electron flow between the electrochemically active element and said gate electrode(s) is prevented; whereby flow of electrons between source contact and drain contact is controllable by means of a voltage applied to said gate electrodes), and
   (B) an electrochromic device comprising: at least one electrochromic element comprising (i) at least one material that is electrically conducting in at least one oxidation state and (ii) at least one electrochromic material, wherein said materials (i) and (ii) can be the same or different; at least one layer of a solidified electrolyte which is in direct electrical contact with said electrochromic element; and at least two electrodes adapted for application of a voltage therebetween; each of said electrodes being in direct electrical contact with a component selected from said electrolyte layer(s) and said electrochromic element;
   in which pixel device one of said source and drain contacts of the electrochemical transistor device A is in electrical contact with one of the electrodes of the electrochromic device B.

2. An electrochemical pixel device according to claim 1, in which the source contact, of the electrochemical transistor device A is in electrical contact with one of the electrodes of the electrochromic device B.

3. An electrochemical pixel device according to claim 1, in which the drain contact of the electrochemical transistor device A is in electrical contact with one of the electrodes of the electrochromic device B.

4. An electrochemical pixel device according to claim 1, in which said source and drain contacts, gate electrode(s) and electrochemically active element of the electrochemical transistor device A are arranged in one common plane.

5. An electrochemical pixel device according to claim 4, in which, in the electrochemical transistor device A, a continuous or interrupted layer of solidified electrolyte covers the electrochemically active element and covers at least partially said gate electrode(s).

6. An electrochemical pixel device according to claim 1, in which, in the electrochemical transistor device A, at least one of said source and drain contacts and gate electrode(s) is formed from the same material as the electrochemically active element.

7. An electrochemical pixel device according to claim 6, in which, in the electrochemical transistor device A, all of said source and drain contacts and gate electrode(s) are formed from the same material as the electrochemically active element.

8. An electrochemical pixel device according to claim 6, in which, in the electrochemical transistor device A, the source and drain contacts and the electrochemically active element are formed from a continuous piece of said material comprising an organic material.

9. An electrochemical pixel device according to claim 7, in which, in the electrochemical transistor device A, the source and drain contacts and the electrochemically active element are formed from a continuous piece of said material comprising an organic material.

10. An electrochemical pixel device according to claim 1, in which, in the electrochromic device B, the electrodes are formed from the same material as the electrochromic element.

11. An electrochemical pixel device according to claim 1, in which the source and drain contacts, the electrochemically active element and the gate electrode(s) of the electrochemical transistor device A and the electrochromic element and the electrodes of the electrochromic device B are all formed form the same material.

12. An electrochemical pixel device according to claim 1, in which, in the electrochemical transistor device A, the organic material is a polymer.

13. An electrochemical pixel device according to claim 1, in which, in the electrochromic device B, the electrochromic material comprises an electrochromic polymer.

14. An electrochemical pixel device according to claim 12, in which the organic material in the electrochemical transistor device A is a polymer and the electrochromic material in the electrochromic device B comprises an electrochromic polymer.

15. An electrochemical pixel device according to claim 13, in which the organic material in the electrochemical transistor device A is a polymer and the electrochromic material in the electrochromic device B comprises an electrochromic polymer.

16. An electrochemical pixel device according to claim 14, in which the electrochromic polymer in the electrochromic device B is the same material as the polymer in the electrochemical transistor device A.

17. An electrochemical pixel device according to claim 12, in which any electrochromic polymer present in the electrochromic device B and any polymer present in the electrochemical transistor device A is selected from the group consisting of polythiophenes, polypyrroles, polyanilines, polyisothianaphtalenes, polyphenylene vinylenes and copolymers thereof.

18. An electrochemical pixel device according to claim 13, in which any electrochromic polymer present in the electrochromic device B and any polymer present in the electrochemical transistor device A is selected from the group consisting of polythiophenes, polypyrroles, polyanilines, polyisothianaphtalenes, polyphenylene vinylenes and copolymers thereof.

19. An electrochemical pixel device according to claim 14, in which any electrochromic polymer present in the electrochromic device B and any polymer present in the electrochemical transistor device A is selected from the group consisting of polythiophenes, polypyrroles, polyanilines, polyisothianaphtalenes, polyphenylene vinylenes and copolymers thereof.

20. An electrochemical pixel device according to claim 16, in which any electrochromic polymer present in the electrochromic device B and any polymer present in the electrochemical transistor device A is selected from the group consisting of polythiophenes, polypyrroles, polyanilines, polyisothianaphtalenes, polyphenylene vinylenes and copolymers thereof.

21. An electrochemical pixel device according to claim 17, in which any electrochromic polymer present in the electrochromic device B and any polymer present in the electrochemical transistor device A is a polymer or copolymer of a 3,4-dialkoxythiophene, in which the two alkoxy groups may be the same or different or together represent an optionally substituted oxy-alkylene-oxy bridge.

22. An electrochemical pixel device according to claim 21, in which said polymer or copolymer of a 3,4-dialkoxythiophene is selected from the group consisting of poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythiophene), poly(3,4-butylenedioxythiophene) derivatives, and copolymers therewith.

23. An electrochemical pixel device according to claim 1, in which the electrochromic material in the electrochromic device B and/or the organic material in the electrochemical transistor device A comprise(s) a polyanion compound.

24. An electrochemical pixel device according to claim 23, in which said polyanion compound is poly(styrene sulfonate) or a salt thereof.

25. An electrochemical pixel device according to claim 1, in which the solidified electrolyte in the electrochemical transistor device A and/or the solidified electrolyte in the electrochromic device B comprise(s) a binder.

26. An electrochemical pixel device according to claim 23, in which said binder is a gelling agent selected from the group consisting of gelatine, a gelatine derivative, polyacrylic acid, polymethacrylic acid, poly(vinylpyrrolidone), polysaccharides, polyacrylamides, polyurethanes, polypropylene oxides, polyethylene oxides, poly(styrene sulphonic acid) and poly(vinyl alcohol), and salts and copolymers thereof.

27. An electrochemical pixel device according to claim 1, in which the solidified electrolyte in the electrochemical transistor device A and/or the solidified electrolyte in the electrochromic device B comprise(s) an ionic salt.

28. An electrochemical pixel device according to claim 1, in which the same solidified electrolyte is used in both the electrochemical transistor device A and the electrochromic device B.

29. An electrochemical pixel device according to claim 1, arranged on a support.

30. An electrochemical pixel device according to claim 29, in which said support is selected from the group consisting of polyethylene terephthalate, polyethylene naphthalene dicarboxylate, polyethylene, polypropylene, polycarbonate, paper, coated paper, resin-coated paper, paper laminates, paperboard, corrugated board and glass.

31. An electrochemical pixel device according to claim 29, in which said support is reflective.

32. An electrochemical pixel device according to claim 30, in which said support is reflective.

33. An electrochemical pixel device according to claim 1, in which, in the electrochromic device B, the electrodes and the electrochromic element are arranged side by side in a common plane.

34. An electrochemical pixel device according to claim 1, in which, in the electrochromic device B, the electrodes and the electrochromic element are arranged vertically.

35. A matrix comprising a plurality of the electrochemical pixel device according to claim 1.

36. A matrix according to claim 35, in which the electrochemical pixel devices have one gate electrode each.

37. A matrix according to claim 35, in which the electrochemical pixel devices have at least two gate electrodes each.

38. A matrix according to claim 37, in which one of the gate electrodes of each electrochemical pixel device is provided with a resistance, in order to minimise cross-talk between pixels.

39. A pixelated display comprising a matrix according to claim 35.

40. A pixelated display comprising a matrix according to claim 36.

41. A pixelated display comprising a matrix according to claim 37.

42. A pixelated display comprising a matrix according to claim 38.

43. A process for the production of an electrochemical pixel device according to claim 1, which process comprises deposition of said contacts, electrodes, electrochemically active element, electrochromic element and electrolyte(s) onto a support.

44. A process according to claim 43, wherein said contacts, electrodes, electrochemically active element, electrochromic element and/or electrolyte(s) are deposited by means of printing techniques.

45. A process according to claim 43, wherein said contacts, electrodes, electrochemically active element, electrochromic element and electrolyte(s) are deposited by means of coating techniques.

46. A process according to claim 43, in which device said organic material of the electrochemical transistor device A and/or said electrochromic element of electrochromic device B comprises a polymer, which process comprises deposition of said polymer on a support through in situ polymerisation.

47. A process according to claim 44, in which device said organic material of the electrochemical transistor device A and/or said electrochromic element of electrochromic device B comprises a polymer, which process comprises deposition of said polymer on a support through in situ polymerisation.

48. A process according to claim 45, in which device said organic material of the electrochemical transistor device A and/or said electrochromic element of electrochromic device B comprises a polymer, which process comprises deposition of said polymer on a support through in situ polymerisation.

49. A process according to claim 43 comprising patterning of any one of contacts, electrodes, electrochemically active element and electrochromic element using a subtractive method.

50. A process according to claim 44 comprising patterning of any one of contacts, electrodes, electrochemically active element and electrochromic element using a subtractive method.

51. A process according to claim 45 comprising patterning of any one of contacts, electrodes, electrochemically active element and electrochromic element using a subtractive method.

52. A process according to claim 46 comprising patterning of any one of contacts, electrodes, electrochemically active element and electrochromic element using a subtractive method.

53. A process according to claim 49, in which said patterning is performed through chemical etching.

54. A process according to claim 49, in which said patterning is performed through gas etching.

55. A process according to claim 49, in which said patterning is performed by mechanical means, comprising scratching, scoring, scraping and milling.

* * * * *